United States Patent [19]

Hu et al.

[11] Patent Number: 5,891,587
[45] Date of Patent: Apr. 6, 1999

[54] ELECTROLUMINESCENT DEVICES

[75] Inventors: Nan-Xing Hu, Oakville; Shuang Xie, Mississauga; Beng S. Ong, Mississauga; Zoran D. Popovic, Mississauga; Ah-Mee Hor, Mississauga; Ping Liu, Mississauga, all of Canada

[73] Assignee: Xerox Corporation, Stamford, Conn.

[21] Appl. No.: 807,510

[22] Filed: Feb. 27, 1997

[51] Int. Cl.⁶ .................................. H05B 33/12
[52] U.S. Cl. .................. 428/690; 428/704; 428/457; 428/411.1; 428/917; 313/503; 313/504; 313/506
[58] Field of Search .................. 428/690, 917, 428/704, 457, 411.1; 313/502, 503, 504, 506; 564/431, 433, 434

[56] References Cited

U.S. PATENT DOCUMENTS

| | | | |
|---|---|---|---|
| 4,356,429 | 10/1982 | Tang | 313/503 |
| 4,539,507 | 9/1985 | VanSlyke et al. | 313/504 |
| 4,769,292 | 9/1988 | Tang et al. | 428/690 |
| 4,950,950 | 8/1990 | Perry et al. | 313/504 |
| 5,150,006 | 9/1992 | VanSlyke et al. | 313/504 |
| 5,256,945 | 10/1993 | Imai et al. | 313/504 |
| 5,374,489 | 12/1994 | Imai et al. | 428/690 |
| 5,487,953 | 1/1996 | Shirota et al. | 428/690 |
| 5,554,450 | 9/1996 | Shi et al. | 428/690 |

FOREIGN PATENT DOCUMENTS 0 650 955 A1  5/1995  European Pat. Off. .

*Primary Examiner*—Marie Yamnitzky
*Attorney, Agent, or Firm*—E. O. Palazzo

[57] ABSTRACT

An organic electroluminescent (EL) device comprised of a starburst aromatic amine compound represented by the formula

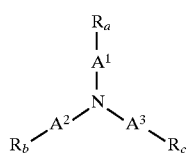

Formula (I)

wherein N is nitrogen; $A^1$ to $A^3$ each individually represent biaryl; $R_a$, $R_b$, and $R_c$ represent independently one of the functional groups of the following formulae

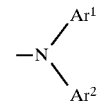

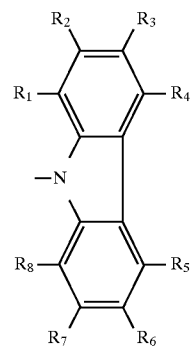

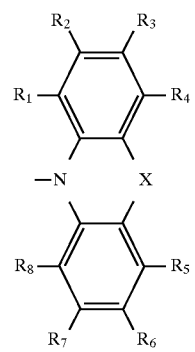

wherein N is nitrogen; each $Ar^1$ and $Ar^2$ are aryl; $R_1$ to $R_8$ are substituents independently selected from the group consisting of hydrogen, halogen, hydrocarbon, and alkoxy; and X represents oxygen, sulfur, or an alkylene.

11 Claims, 1 Drawing Sheet

ELECTROLUMINESCENT DEVICES

PENDING APPLICATIONS

Illustrated in copending applications U.S. Ser. No. 807,488 and U.S. Ser. No. 807,489 are certain EL devices; and U.S. Ser. No. 807,487 (now U.S. Pat No. 5,747,205) relates to a process for the preparation of starburst amines and photoconductive imaging members, each application being filed concurrently herewith, and the disclosures of each application being totally incorporated herein by reference.

In U.S. Pat. No. 5,674,635, the disclosure of which is totally incorporated herein by reference, there is illustrated an electroluminescent device comprising a polymer of a tetraaryl-substituted biphenyidiamine, such as a copolymer of N,N'-diphenyl-N,N'-bis(3-hydroxyphenyl)-1,1'-biphenyl-4,4'-diamine with a member selected from the group consisting of bisphenyl-A-bischloroformate, ethyleneglycol bischloroformate, diethyleneglycol bischloroformate, adipoylchloride, suberoylchloride and sebacoylchloride, or a siloxane based N,N'-diphenylN,N'-bis(3-hydroxyphenyl)-1,1'-biphenyl-4,4'-diamine polymer. In the above-mentioned patent, the hole transport polymers can be deposited by solution coating techniques, such as spin coating, dip coating, and spray coating, which impose certain restrictions on the manufacturing processes thereof. These polymeric amines in thin films of submicron thickness cannot be effectively prepared by vacuum deposition as they tend to decompose during the thermal heating process. Furthermore, the synthesis and purification of polymeric hole transport materials are generally tedious and labor intensive.

Efforts have been devoted to developing energy-efficient flatpanel displays based on organic electroluminescent devices primarily because of their capability of providing an emissive display without restricted viewing angles, low operating voltages, and high levels of light output. However, the current performance shortfalls of organic EL devices, such as short serviceable life and low EL efficiency, have presented challenging technological hurdles to their practical applications. One of the objectives of the present invention is, therefore, to provide organic EL devices with a prolonged serviceable life span, and a high level of EL efficiency characteristics.

BACKGROUND OF THE INVENTION

This invention is generally directed to electroluminescent (EL) devices. More specifically, this invention is directed to organic EL devices with enhanced thermal and operational stability, and thus improved durability, and which devices utilize novel hole transport compositions comprised of starburst aromatic amines, which amines can form amorphous films with excellent to superior thermal stability. There are also disclosed processes for the preparation of starburst aromatic amines, and which amines may be selected for photoconductive imaging members, especially layered imaging members and wherein the starburst amines function primarily as charge transport components, or molecules, such as the photoconductive imaging members illustrated in U.S. Pat. No. 4,265,990, the disclosure of which is totally incorporated herein by reference.

PRIOR ART

Prior art organic EL devices have been constructed from a laminate of an organic luminescent material and electrodes of opposite polarity, which devices include a single crystal material, such as single crystal anthracene, as the luminescent substance as described, for example, in U.S. Pat. No. 3,530,325. However, these devices require excitation voltages on the order of 100 volts or greater. Subsequent modifications of the device structure through incorporation of additional layers, such as charge injecting and charge transport layers, have led to performance improvement. Illustrative examples of EL devices have been disclosed in publications by Tang et al. in *J. Appl. Phys.* vol. 65, pp. 3610 to 3616 (1989) and Saito et al. in *Mol. Cryst. Liq. Cryst.* vol. 253, pp. 125 to 132 (1994), the disclosures of which are totally incorporated herein by reference. Moreover, U.S. Pat. No. 4,950,950 illustrates a multilayer EL device with silane hole transporting agents. U.S. Pat. No. 4,356,429 illustrates organic EL cells with a hole injecting porphyrinic layer.

An EL device with an organic dual layer structure comprises one layer adjacent to the anode supporting hole injection and transport, and another layer adjacent to the cathode supporting electron injection and transport. The recombination of charge carriers and subsequent emission of light occurs in one of the layers near the interface between the two layers. Optionally, a fluorescent material capable of emitting light in response to recombination of holes and electrons can be added to one of the layers. In another configuration, an EL device can comprise three separate layers, a hole transport layer, an emission layer, and an electron transport layer, which are laminated in sequence and are sandwiched as a whole between an anode and a cathode.

Although recent performance improvements in organic EL devices have suggested a potential for widespread use, most practical applications require limited operation voltage or light output variance over an extended period of time. Many current organic EL devices possess limited operational lifetime, particularly at a high temperature of, for example, above 40° C. (Centigrade). One aspect which significantly affects the performance of organic EL devices is the thermal and morphological stability of the organic layers comprising the devices. These layers are amorphous thin films formed by vacuum deposition technique. The transition of an organic thin film from an amorphous state to a crystalline state can result in a physical or morphological change in the thin film. The integrity of organic EL devices with multi-layer structures is sensitive to this morphological change primarily because the charge carriers transport characteristics are substantially affected by the microscopic structures of the organic layers. Since the transition is generally dependent on temperature, a transition temperature from an amorphous state to a crystalline state is known as a glass transition temperature Tg. Thus, to improve the thermal and operation stability of organic EL devices, it is important that the organic materials comprising the layers in the devices possess high glass transition temperatures.

While hole transport materials comprised of certain aromatic tertiary amines are generally known to facilitate hole injection and hole transport processes which lead to improved device performance for organic EL devices, the thermal and morphological instability of these materials as the hole injecting and transport thin film layers has resulted in the short operational lifetime and poor durability of the organic EL devices for practical applications.

To overcome the above-mentioned complexities and difficulties associated with the organic EL devices, this invention provides a class of novel hole transporting materials which are capable of forming amorphous thin films with enhanced thermal and morphological stability and organic EL devices fabricated therefrom with superior hole injection characteristics, high excellent EL efficiency, and enhanced operation stability and device durability.

FIGURES

Illustrated in FIGS. 1 and 2 are EL device of the present invention.

SUMMARY OF THE INVENTION

Examples of objects include:

It is an object of the present invention to provide organic EL devices with many of the advantages illustrated herein.

Another object of the present invention is to provide organic EL devices with enhanced thermal stability and operational stability.

In another object of the present invention there are provided improved EL devices which exhibit high electroluminescence efficiency at relatively low operating voltages of, for example, below about 20 volts, such as from about 5 to about 19.5 volts.

Yet in another object of the present invention there are provided improved EL devices comprising an anode and a cathode, and an organic electroluminescent medium between the anode and the cathode, wherein the organic electroluminescent medium has at least one layer containing a starburst aromatic amine hole transport component.

Another object of the present invention is the provision of certain starburst aromatic amine compounds for EL devices, which compounds have a high glass transition temperature of, for example, above 100° C. (Centigrade), and a process for the preparation of the starburst aromatic amines.

A further object of the present invention is the provision of EL devices with starburst aromatic amines which possess excellent hole injecting and transporting capability, superior thermal stability, and which can be readily vacuum deposited as thin films for use as hole injection and or transport components in EL devices.

Moreover, in another object of the present there are provided processes for the preparation of starburst amines, and photoconductive imaging members thereof.

In embodiments, the present invention relates to layered organic EL devices comprising an anode, a cathode, and therebetween the anode and the cathode an organic luminescent medium comprised of an hole injecting and hole transporting zone or layer containing a starburst aromatic amine, an electron injecting and transporting zone or layer, and which devices possess a number of advantages such as improved thermal stability, long device life, high electroluminescence efficiency, superior hole injecting and electron transporting characteristics, and which devices can be readily fabricated using vacuum deposition techniques. The invention EL devices exhibit improved thermal and operational stability, and excellent device durability at temperatures around and above 50° C., for example from about 50° to about 100° C.

In embodiments, the present invention relates to EL devices that are comprised in the following order of a supporting substrate, an anode, a hole injecting and transporting zone or layer, an electron injecting and transporting zone or layer, and a cathode, and wherein the hole injecting and transporting zone is comprised of a starburst aromatic amine represented by the following Formula

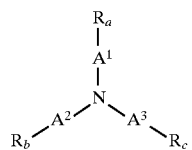

Formula (I)

wherein N is nitrogen; $A^1$ to $A^3$ individually represent a biaryl with, for example, from 12 to about 60 carbon atoms, such as a biphenyl group, a bitolyl group, and the like; $R_a$, $R_b$, and $R_c$ represent independently one of the following functional groups of the formulas indicated and wherein N is nitrogen; $Ar^1$ and $Ar^2$ are aryl groups with, for example, from 6 to about 24 carbon atoms, such as a phenyl group, a tolyl group, a halo, such as chlorophenyl group, an alkoxy, such as a methoxyphenyl group, a biphenyl group, or a naphthyl group and the like; $R_1$ to $R_8$ are substituents independently selected from the group consisting of hydrogen, halogen, or hydrocarbon groups, for example from 1 to 10 carbon atoms, and alkoxy groups containing, for example, from 1 to 6 carbon atoms; and X represents an oxygen atom, a sulfur atom, or an alkylene with, for example, from about 2 to about 20 carbon atoms like a methylene group.

DESCRIPTION OF EMBODIMENTS

Embodiments of the present invention will be described in more details with reference to the schematic diagram as provided in FIG. 1, and in FIG. 2.

Figure 1:
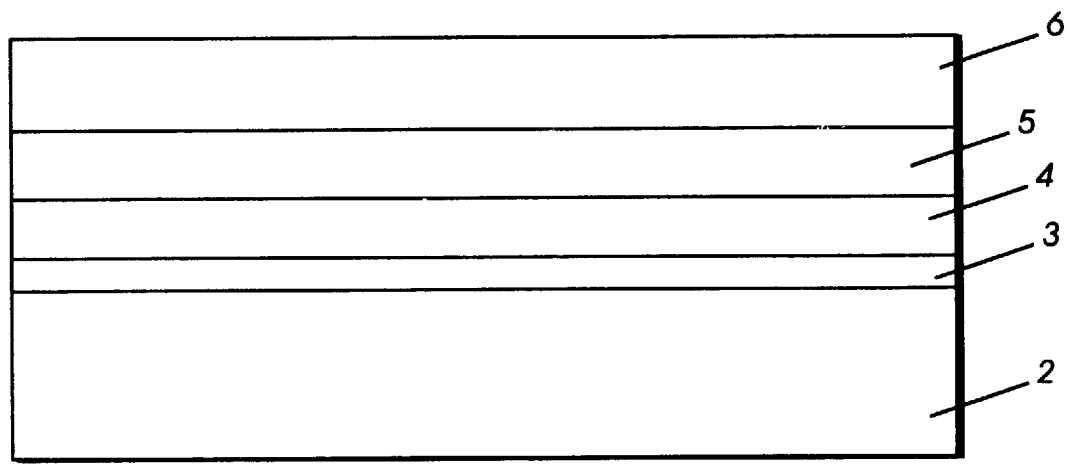
Figure 2:
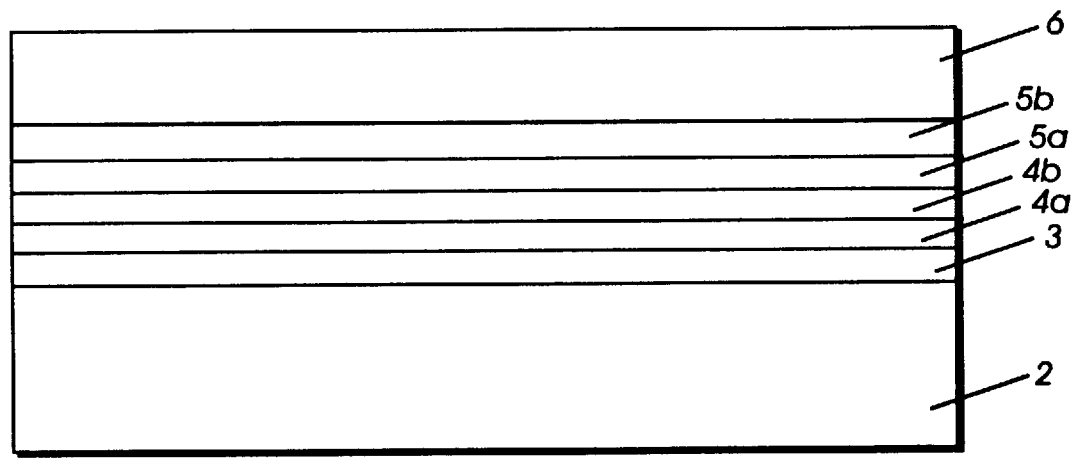

More specifically, FIG. 1 illustrates an EL device which comprises an organic light emitting diode comprised of a supporting substrate 2 of, for example, glass, an anode 3, a vacuum deposited hole injecting and hole transporting layer 4 comprised of a starburst aromatic amine, an electron injecting and electron transporting layer 5, and in contact therewith a low work function metal as a cathode 6. In the EL device a luminescent zone, in which the electron-hole recombination takes place with subsequent light emission, encompasses the hole transport layer and/or the electron transport layer. Optionally, a fluorescent material, which is capable of emitting light subsequent to electron-hole recombination, may be added to the luminescent zone wherein the charge transport component functions as the host material.

The hole injecting layer may function in embodiment to inject holes, transport holes, or a combination thereof; and the electron injecting layer can similarly inject electrons, transport electrons, or a combination thereof. Also, in embodiments a zone may replace 4 and 5, reference FIG. 2, 4 being replaced by 4a in contact with the anode, a hole injecting layer, and thereover 4b the starburst hole transport layer; and over 4b, 5a an electron transporting layer, and thereover 5a, 5b an electron injecting layer.

Illustrative examples of supporting substrates include polymeric components, glass and the like, and polyesters like MYLAR®, polycarbonates, polyacrylates, polymethacrylates, polysulfones, quartz, and the like. Other substrates can be selected providing, for example, that they are essentially nonfunctional and can support the other layers. The thickness of the substrate can be, for example, from about 25 to about 1,000 microns or more, and more specifically, from about 50 to about 6,000 microns depending, for example, on the structural demands of the device.

Examples of anodes contiguous to the substrate include positive charge injecting electrodes such as indium tin oxide, tin oxide, gold, platinum; electrically conductive carbon, π-conjugated polymers such as polyaniline, polypyrrole, and the like, with a work function equal to, or greater than about 4 electron volts, for example from about 4 to about 8 electron volts. The thickness of the anode can range from about 10 to 5,000 Å with the preferred range being dictated by the optical constants of the anode material. One preferred range of thickness is from about 20 to about 1,000 Angstroms.

The hole transport layer 4 is as illustrated herein and is comprised of a starburst aromatic amine represented by the following structural Formula

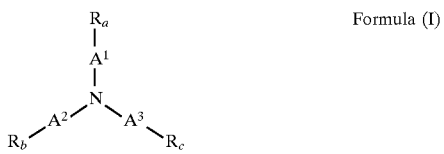

Formula (I)

wherein the substituents are as indicated herein, for example $A^1$ to $A^3$ individually represent a biaryl with, for example, 12 to about 60, preferably 12 to about 40 carbon atoms, and which biaryl may be substituted, and more specifically, a biphenyl group or a bitolyl group; $R_a$, $R_b$, and $R_c$ represent independently one of the functional groups of the following formulas:

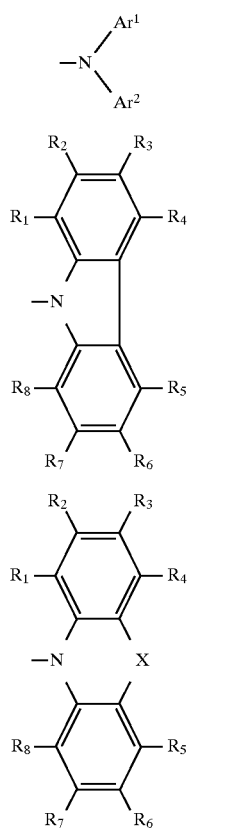

wherein N is nitrogen; the other substituents are as illustrated herein, such as $Ar^1$ and $Ar^2$ are aryl groups such as a phenyl group, a tolyl group, a chlorophenyl group, a methoxyphenyl group, a biphenyl group, or a naphthyl group and the like; $R_1$ to $R_8$ are substituents independently selected from the group consisting of hydrogen, halogen, or hydrocarbons containing from 1 to about 10 carbon atoms, and alkoxy containing from 1 to 6 carbon atoms; X represents an oxygen atom, a sulfur atom, or an alkylene with, for example, from 2 to about 20 carbon atoms, such as a methylene group. This new class of starburst aromatic amines exhibit many advantages as illustrated herein, and these compounds are vacuum evaporatable, capable of forming a thin film, and they generally possess a high glass transition temperature. Moreover, these starburst amines can be selected as hole transport components in layered photoconductive imaging members, which members can be selected for xerographic imaging methods, including digital methods.

The starburst aromatic amines can be prepared by a direct Ullmann condensation of primary arylamine (II) with aryl iodides (III) and (IV) in the presence of a ligand copper catalyst as illustrated in Scheme 1, and reference to U.S. Pat. No. 5,648,542, U.S. Pat. No. 5,654,482 and U.S. Pat. No. 5,648,539, the disclosures of which are totally incorporated herein by reference. The substituents, such as Ra in Scheme 1 are as illustrated herein

SCHEME 1

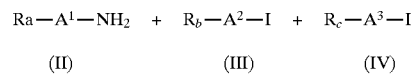

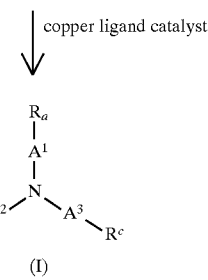

More specifically, the process for the preparation of starburst amines of Formula (I) comprises the reaction of primary arylamine (II) with aromatic iodide compound of Formula (III) and aromatic iodide compound of Formula (IV), and which reaction is accomplished in the presence of a ligated copper catalyst, and wherein the ligand is selected from the group consisting of monodentate tertiary amines and bidentate tertiary amines. The reaction is generally accomplished in an inert solvent, such as toluene, xylene, mesitylene, dodecane, and the like, at a temperature ranging, for example, from about 100° C. to about 190° C., and preferably from about 120° C. to about 160° C., in the presence of a ligated copper catalyst, such as 1,10-phenanthrolato copper (1) (monovalent) chloride, dipyridino copper (1) chloride, 1,10-phenanthrolato copper (1) bromide, dipyridino copper (1) bromide, 1,10-phenanthrolato copper (1) chloride, 1,10-phenanthrolato copper (1) bromide, or dipyridino copper (1) bromide. The catalyst selected is of importance and in embodiments is comprised of a copper containing organic ligand, and wherein the ligand is selected from the group consisting of monodentate tertiary amines and bidentate tertiary amines as indicated herein, and more specifically, copper catalysts or compounds, such as (1,10-phenanthrolato)Cu(X) and bis (pyridinato)Cu(X), wherein X is a halide, such as chloride. Ligation of the copper salt dramatically increases catalyst efficiency permitting very rapid reactions to occur, generally over about several hours, at lower temperatures.

The important catalyst selected for the processes of the present invention is as illustrated herein, and in embodiments is comprised of ligated copper salts, including the halide salts, such as chloride, bromide, iodide, and fluoride, especially copper (1), and wherein the ligands are monodentate tertiary amines, or bidentate tertiary amines, such as 1,10-phenanthroline or pyridine. The amount of catalyst selected can vary, and generally, the catalyst is employed in effective amounts, such as from about 1 to about 20 mole percent of the reactants, and preferably from about 5 to about 12 mole percent of the limiting reactant. Examples of postulated formula structures for the copper catalysts include

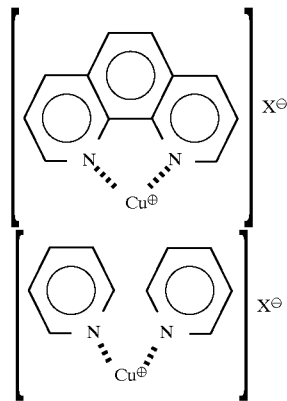

wherein X denotes a halide such as chloride or bromide.

The catalysts can be prepared as illustrated in the appropriate previously recited copending applications Ser. Nos. 807,488, 807,489, 807,487 and U.S. Pat. No. 5,674,635, and more specifically, by the reaction of a copper salt like cuprous chloride with the appropriate ligand like 1,10-phenanthroline, and which reaction is accomplished with heating, for example, from about 70° C. to about 125° C. The reaction mixture is cooled and the product catalyst may, it is believed, be isolated by, for example, filtration. Preferably, the catalyst is prepared in situ.

Specific examples of starburst aromatic amines of the present invention include (1) tris[4'-(phenyl-m-tolyl-amino)-1,1'-biphenyl-4-yl]amine, (2) N,N-bis(4'-di-m-tolylamino-1,1'-biphenyl-4-yl)-N', N'-diphenylbenzidine, (3) tris[4'-(m-methoxydiphenylamino)-1,1'-biphenyl-4-yl] amine, (4) tris[4'-(diphenylamino)-1,1'-biphenyl-4-yl] amine, (5) tris[4'-(carbazol-9-yl)-1,1'-biphenyl-4-yl]amine, (6) tris[4'-(1-naphthylphenylamino) 1,1'-biphenyl-4-yl] amine, (7) N,N-bis[4'-(phenyl-m-tolylamino)-1,1'-biphenyl-4-yl]-N'-phenyl-N'-m-tolyl-3,3'-dimethylbenzidine, (8) N,N-bis(4'-diphenylamino-1,1'-biphenyl-4-yl)-N'-phenyl-N'-m-tolyl-3,3'-dimethylbenzidine, (9) N,N-bis(diphenylamino-1,1'-biphenyl-4-yl)-N'-phenyl-N'-m-tolylbenzidine, (10) N,N-bis[4'-(di-m-tolylamino)-1,1'-biphenyl-4-yl]-N'-phenyl-N'-p-tolylbenzidine, (11) tris[4'-(8H-10H-acridin-10-yl)-1,1'-biphenyl-4-yl]amine, (12) tris[4'-(9,9-dimethyl-9H-10H-acridin-10-yl)-1,1'-biphenyl-4-yl]amine, (13) tris[4'-phenoxazin-10-yl-1,1'-biphenyl-4-yl] amine, (14) tris[4'-phenothiaxazin-10-yl-1,1'-biphenyl-4-yl] amine, (15) N,N-bis[4'-(phenyl-m-tolylamino)-1,1'-biphenyl-4-yl]-4'-(carbazol-9-yl)-1,1'-biphenyl-4-amine, (16) N,N-bis[4'-(carbazol-9-yl)-1,1'-biphenyl-4-yl]-N'-phenyl-N'-m-tolylbenzidine, (17) N,N-bis[4'-(1-naphthylphenylamino)-1,1'-biphenyl-4-yl]-4'-(carbazol-9-yl)-1,1'-biphenyl-4-amine, (18) N,N-bis[4'-(9H-10H-acridin-10-yl)-1,1'-biphenyl-4-yl]-4'-(9H-10H-acridin-10-yl)-3,3'-dimethyl-1,1'-biphenyl-4-amine, and the like.

(1)

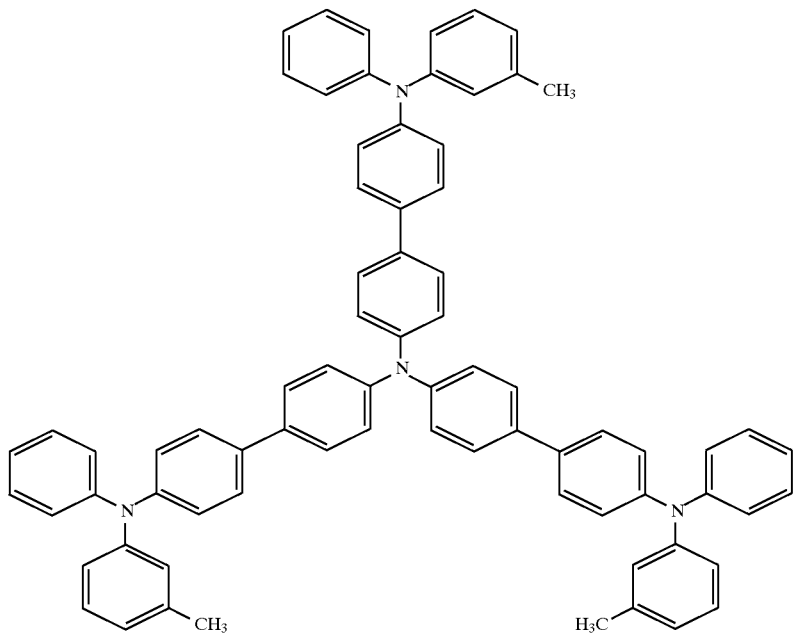

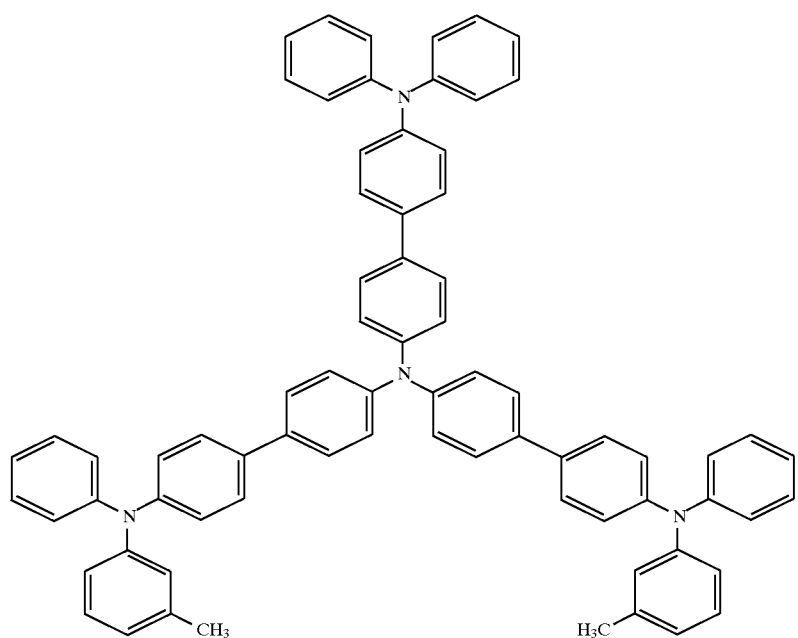
(2)
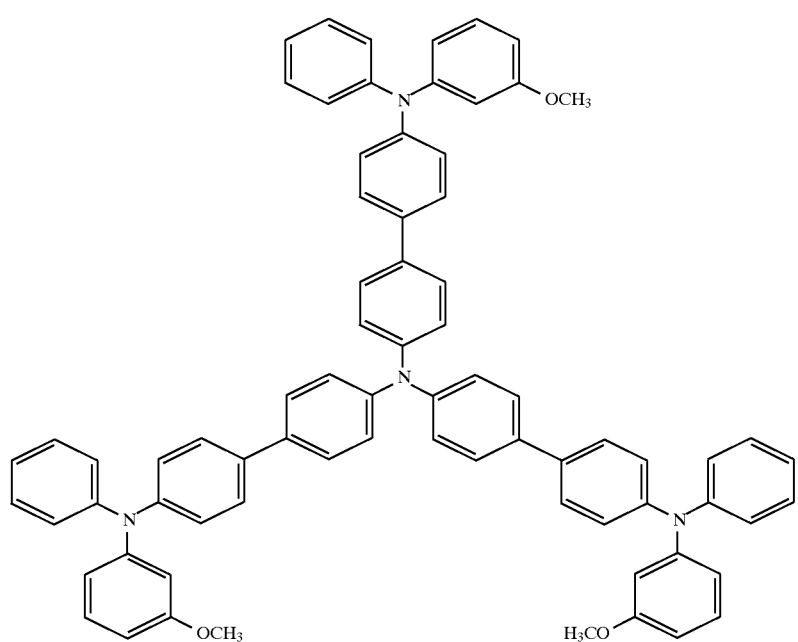
(3)

-continued
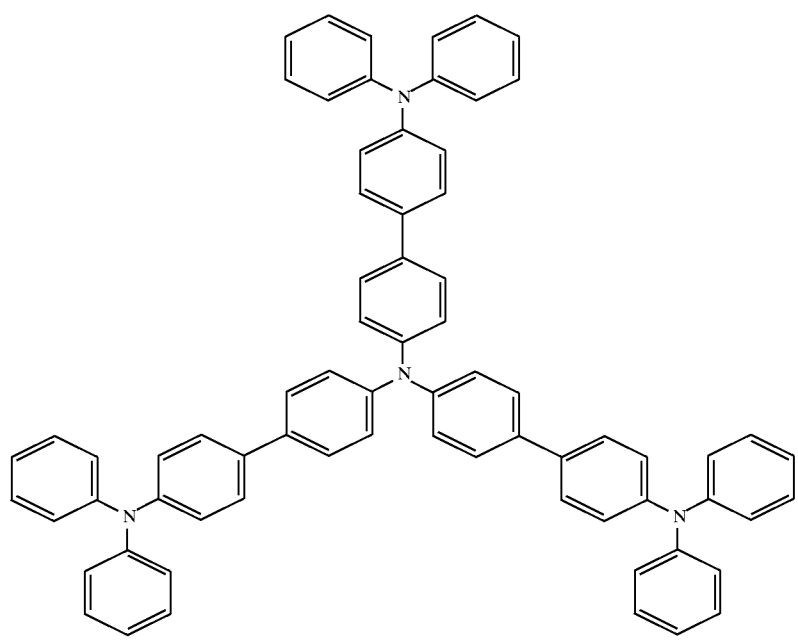
(4)
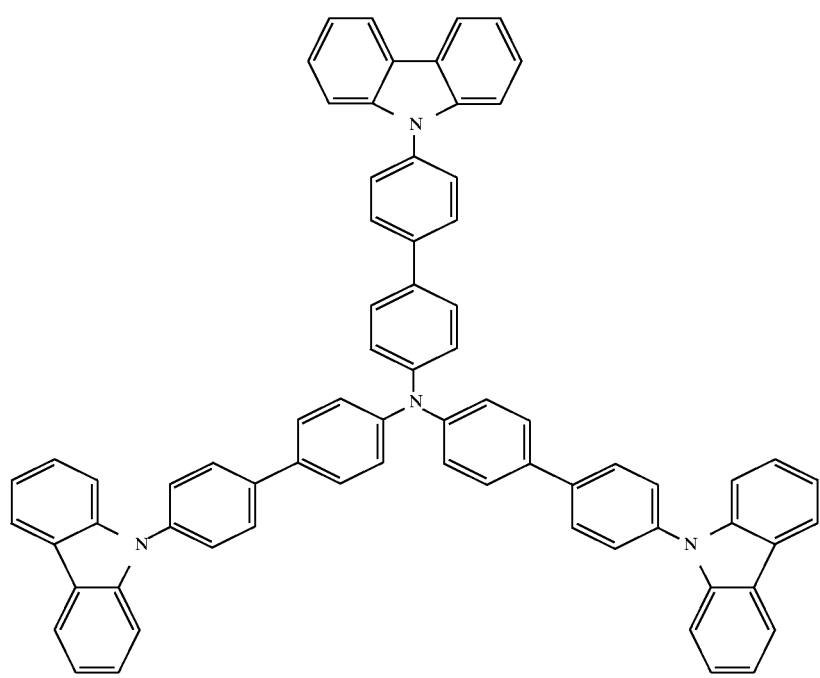
(5)

-continued
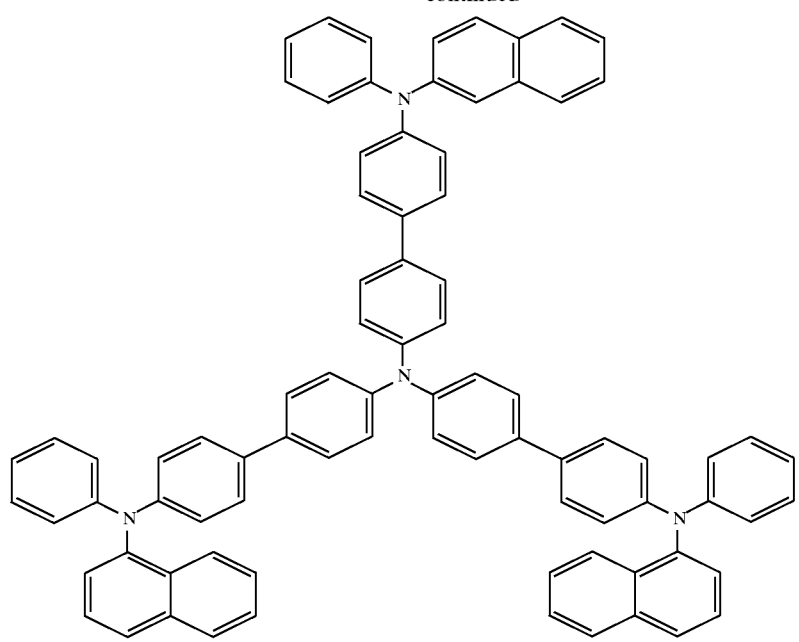
(6)
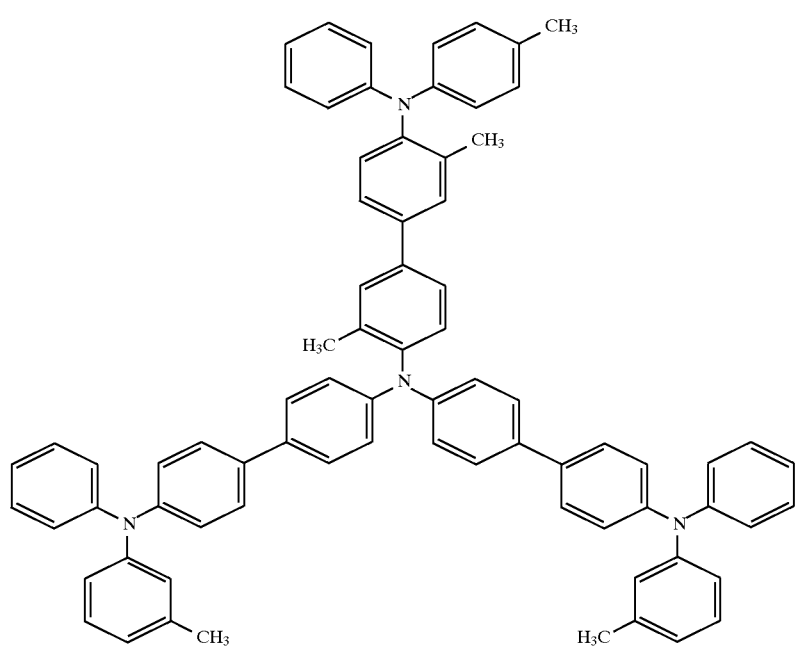
(7)

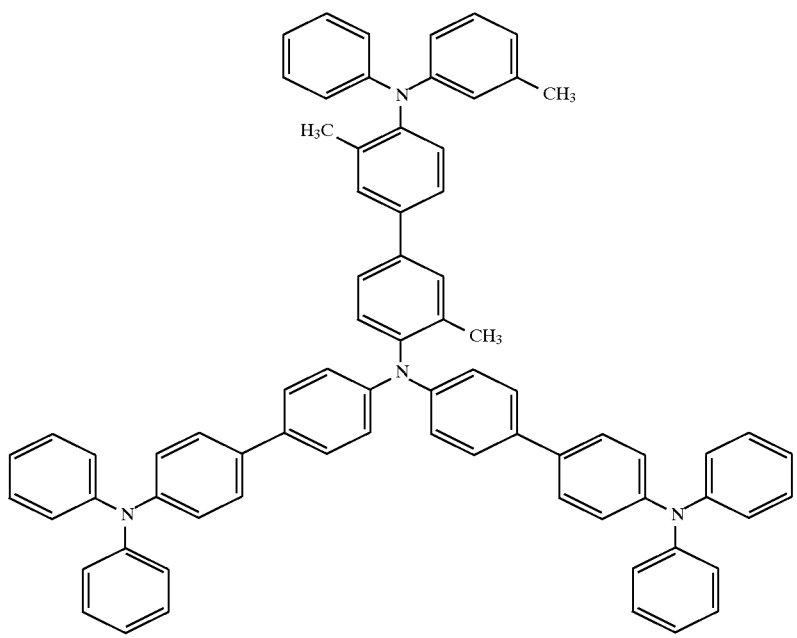
(8)
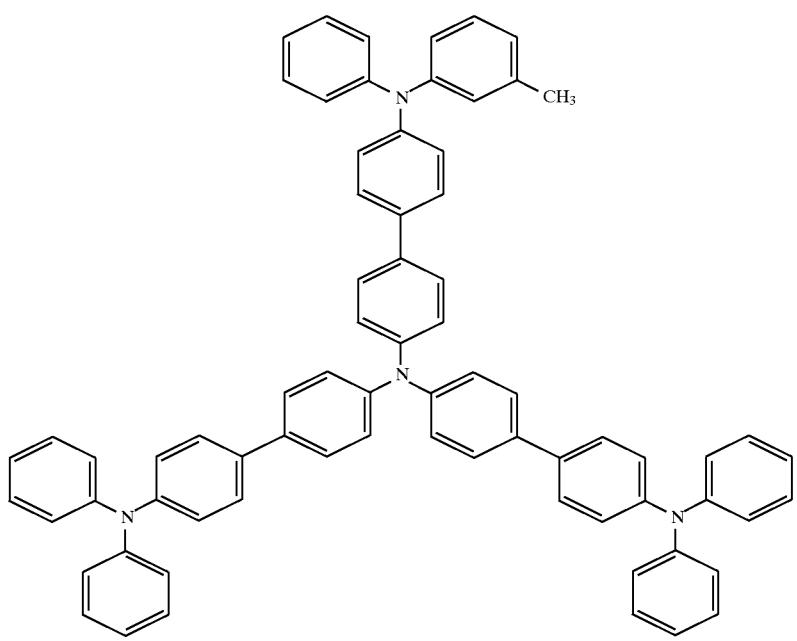
(9)

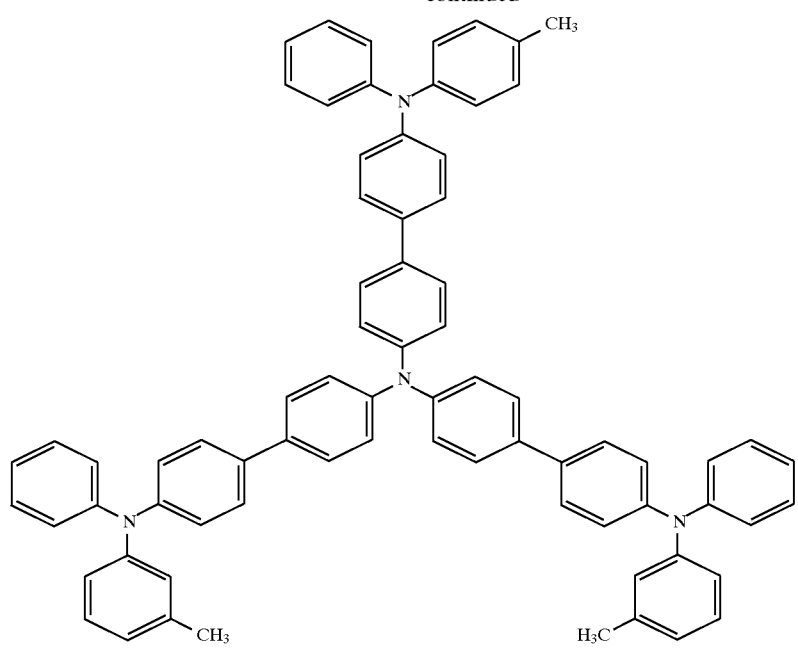
(10)
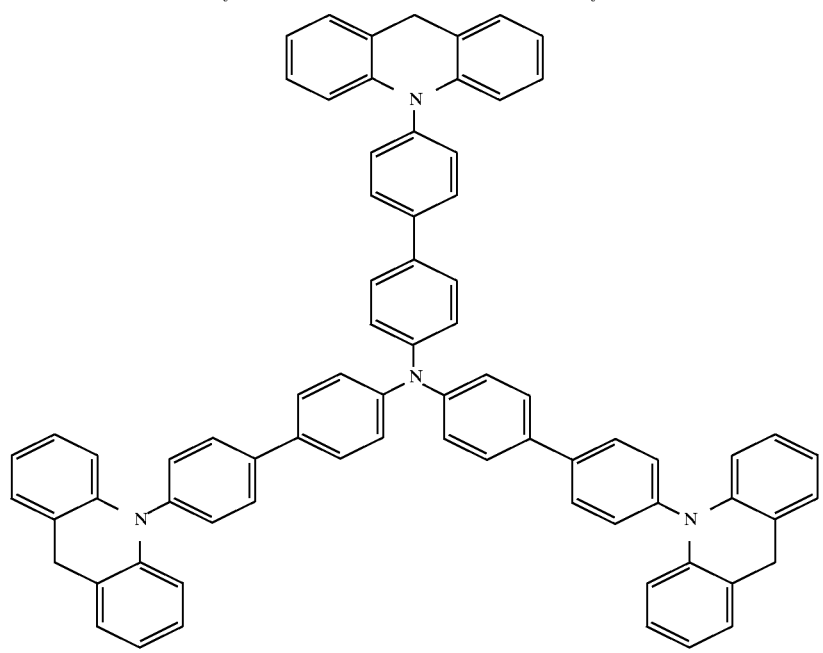
(11)

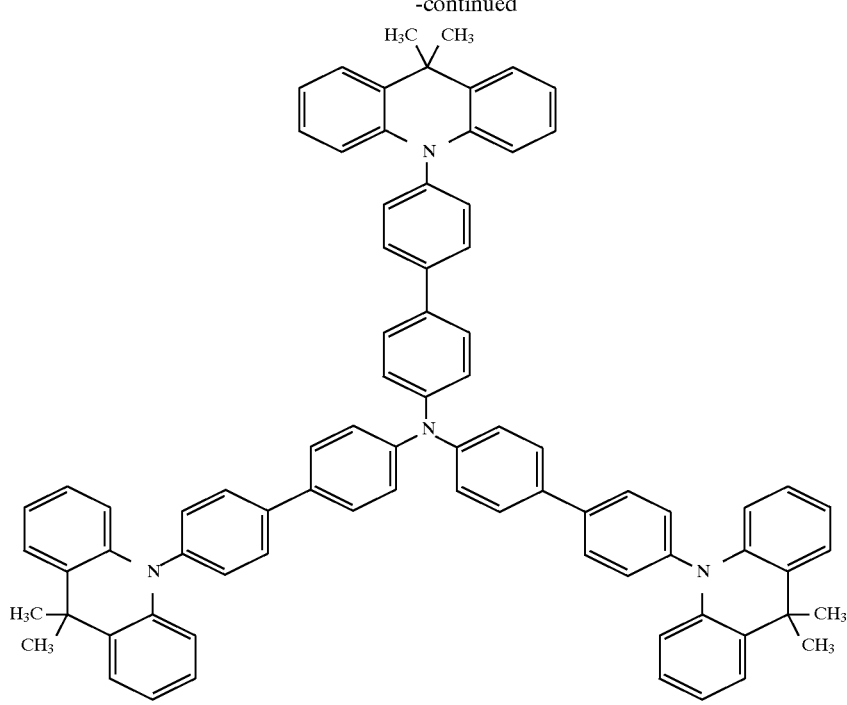
(12)
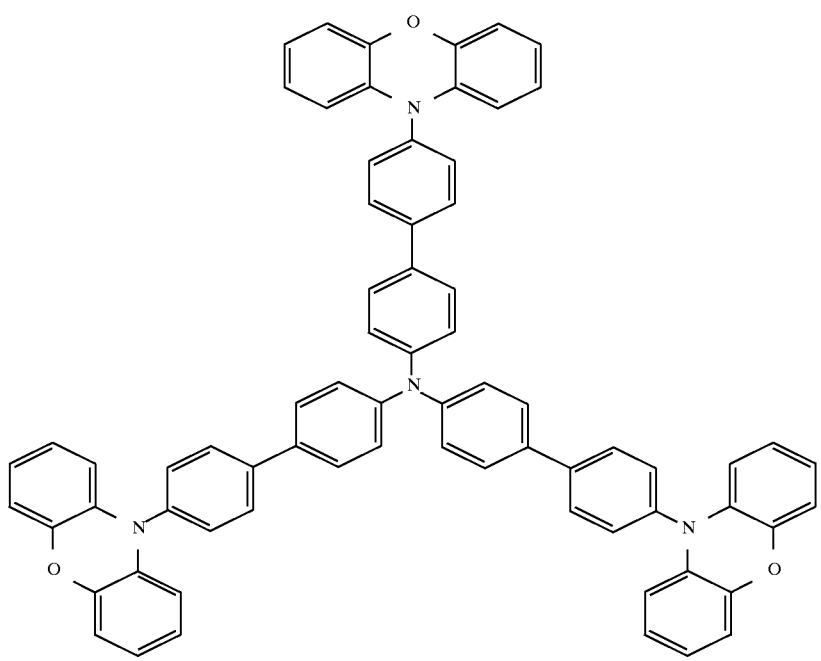
(13)

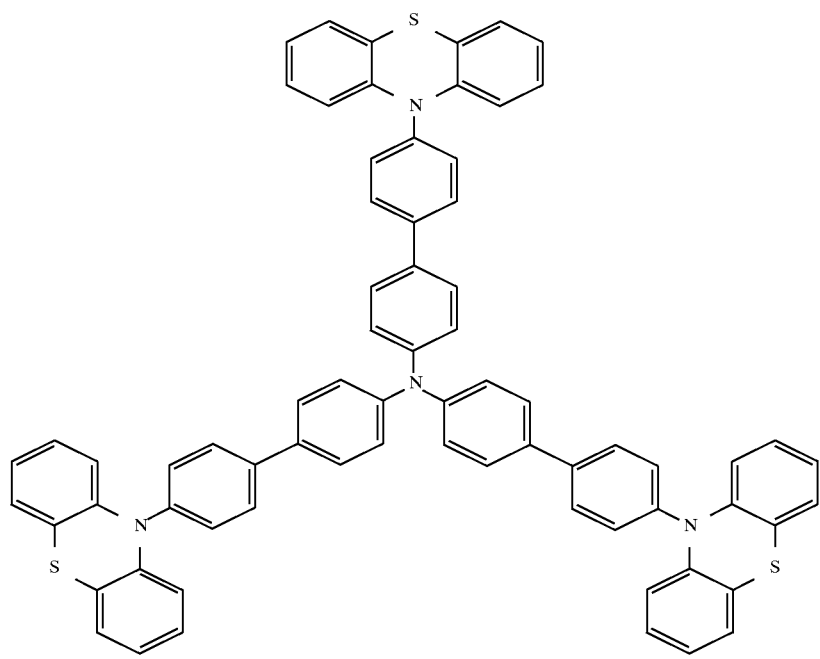
(14)
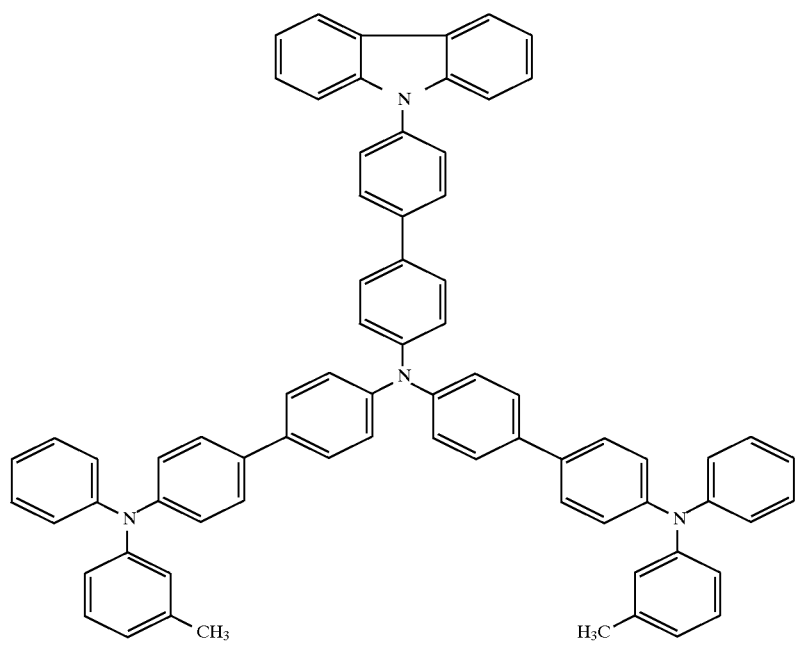
(15)

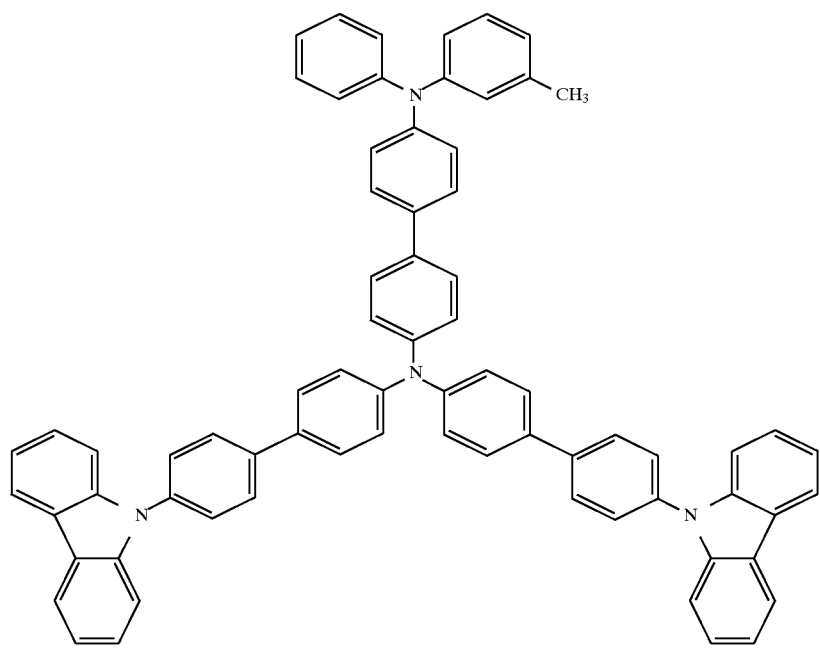
(16)
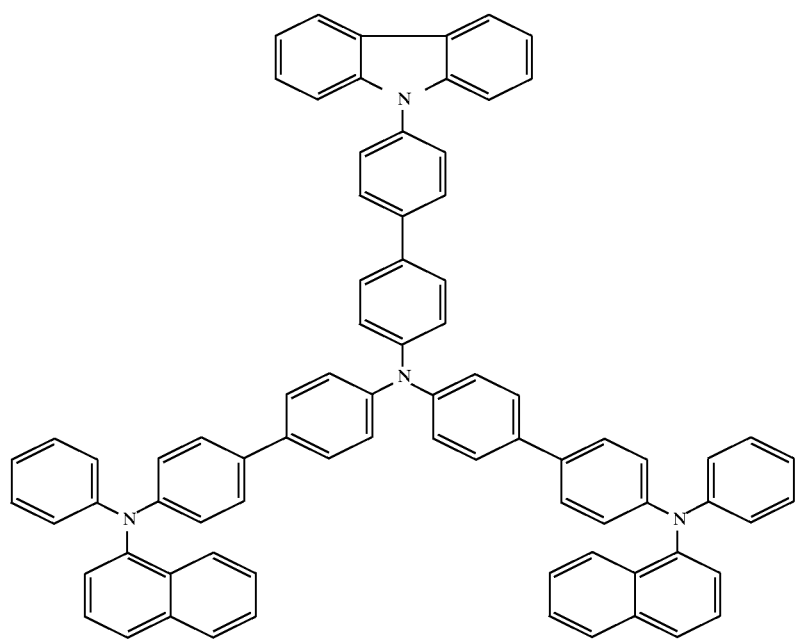
(17)

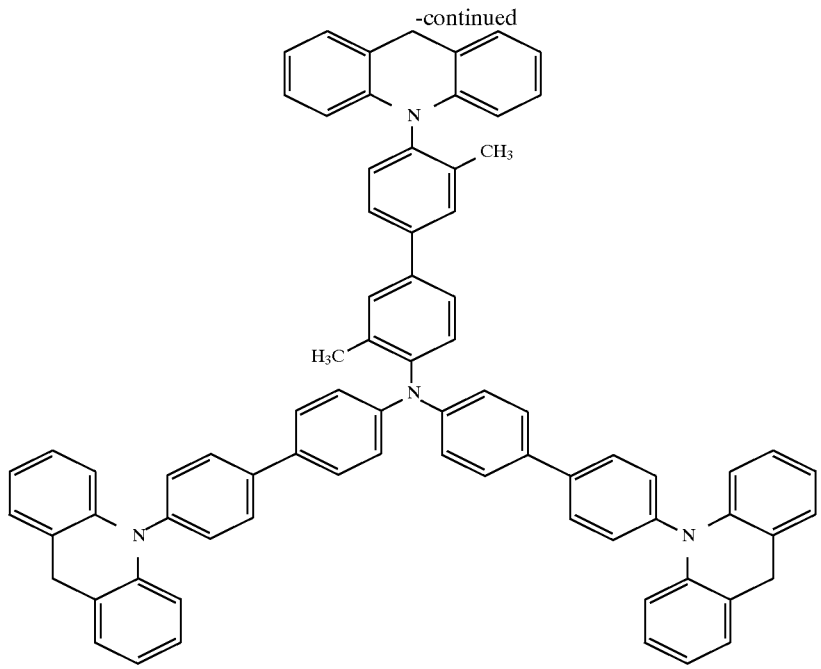

(18)

In accordance with the present invention, the hole injecting and hole transporting zone can be entirely formed of a single layer comprised of an aforementioned starburst aromatic amine. Further, it can be advantageous for the hole injecting and transporting zone to be comprised of a starburst aromatic amine in combination with a porphyrinic compound or a tetraarylamine compound. When a starburst aromatic amine in effective amounts, such as from about 75 to about 95 weight percent, is utilized in combination with a porphyrinic compound, the porphyrinic can be a compound positioned as a layer interposed between the anode and the starburst aromatic amine layer. Examples of porphyrinic compounds are porphyrine; 1,10,15,20-tetraphenyl-21H,23H-porphyrin copper (II); copper phthalocyanine, copper tetramethyl phthalocyanine; zinc phthalocyanine; titanium phthalocyanine oxide; magnesium phthalocyanine; and the like.

When the starburst aromatic amine compound is selected in combination with a triarylamine, tetraarylamine, and the like in forming the hole injecting and transporting zone, the amine is positioned as a layer, for example at a thickness of from about 200 Angstroms, interposed between the starburst aromatic amine layer and the electron injecting and transporting zone. Illustrative examples of aromatic tertiary amines are as illustrated in the appropriate previously recited copending applications Ser. Nos. 807,488, 807,489, 807,487 and U.S. Pat. No. 5,674,635, and include the following:

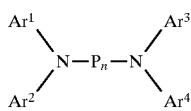

wherein $Ar^1$ to $Ar^4$ are aryl groups with, for example, 6 to about 30 carbon atoms, and, for example, independently selected from phenyl, tolyl, xylyl, naphthyl, 4-biphenylyl, and the like; P is an arylene, like a phenylene group; and n is an integer of from 1 to 4. Specific examples include N,N'-diphenyl-N,N'-bis(3-methylphenyl)-1,1'-biphenyl-4,4'-diamine, N,N'-diphenyl-N,N'bis(4-methylphenyl)-1,1'-biphenyl-4,4'-diamine, N,N,N', N'-tetra-p-tolyl-1,1'-biphenyl-4,4'-diamine, N,N'-di-1-naphthyl-N,N'-diphenyl-1,1'-biphenyl-4,4'-diamine, N,N'-di-2-naphthyl-N,N'-diphenyl-1,1'-biphenyl-4,4'-diamine, N,N'-di-1-naphthyl-N,N'-bis(3-methylphenyl)-1,1'-biphenyl-4,4'-diamine, N,N'-di-1-naphthyl-N,N'-bis(4-methylphenyl)-1,1'-biphenyl-4,4'-diamine, N,N'-di-4-biphenylyl-N,N'-diphenyl-1,1'-biphenyl-4,4'-diamine, N,N'-di-4-biphenylyl-N,N'-bis(4-methylphenyl)-1,1'-biphenyl-4,4'-diamine, and the like.

The electron injecting and transporting zone in the EL devices of the present invention can be comprised of any conventional electron injecting and transporting compound or compounds. Examples of useful electron transport compounds include fused ring luminescent materials such as anthracene, phenathrecene, pyrene, perylene, and the like as illustrated by U.S. Pat. No. 3,172,862; butadienes such as 1,4-diphenylbutadiene and tetraphenylbutadiene, and stilbenes, and the like as illustrated in U.S. Pat. Nos. 4,356,429 and 5,516,577; optical brightness such as those disclosed by U.S. Pat. No. 4,539,507, the disclosures of which are totally incorporated herein by reference.

Particularly preferred electron transport materials are metal chelates of 8-hydroxyquinoline disclosed in U.S. Pat. Nos. 4,539,507; 5,151,629, and 5,150,006. Illustrative examples of the metal chelated compounds include tris(8-hydroxyquinolate)aluminum (AIQ3), tris(8-hydroxyquinolate) gallium, bis(8-hydroxyquinolate) magnesium, bis(8-hydroxyquinolate)zinc, tris(5-methyl-8-hydroxyquinolate)aluminum, tris(7-propyl-8-quinolinolato)aluminum, bis[benzo{f}-8-quinolinate]zinc, bis(10-hydroxybenzo[h]quinolinate)beryllium, bis(2-methylquinolinolato) aluminum(III)-μ-oxo-bis(2-methyl-8-quinolinolato) aluminum(III), bis(2-methyl-8-quinolinolato) (phenolato)aluminum, bis(2-methyl-8-quinolinolato) (para-phenylphenolato)aluminum, bis(2-methyl-8-quinolinolato) (2-naphthalolato)aluminum, and the like.

The disclosures of each of the above patents is totally incorporated herein by reference.

Another class of preferred electron injecting and transporting compounds is metal thioxinoid compounds, disclosed in U.S. Pat. No. 5,648,542. Illustrative examples of metal thioxinoid compounds include bis(8-quinolinethiolato), bis(8-quinolinethiolato) cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato) cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like.

In embodiments of the present invention, the total thickness of the organic luminescent medium, which includes the hole injecting and transporting zone 4 and the electron injecting and transporting zone 5, is preferably, for example, less than about 1 micron, for example from about 0.05 to about 1 micron, to maintain a current density compatible with an efficient light emission under a relatively low voltage applied across the electrodes. Suitable thickness of the hole injecting and transporting layer can range from about 50 to about 2,000 Å, and preferably from about 400 to 1,000 Å. Similarly, the thickness of the electron injecting and transporting layer can range from about 50 to about 2,000 Å, and preferably from about 400 to 1,000 Å.

The cathode 6 can be comprised of any metal, including high or low work function metals. The cathode which can be derived from a combination of a low work function metal, for example less than about 4 eV, for example from about 2 to about 4, and at least one second metal can provide additional advantages such as improved device performance and stability. Suitable proportions of the low work function metal to the second metal may range from less than about 0.1 percent to about 99.9 percent by weight, and in embodiments are from about 1 to about 90 weight percent. Illustrative examples of low work function metals include alkaline metals, Group 2A or alkaline earth metals, and Group III metals including rare earth metals and the actinide group metals. Lithium, magnesium and calcium are particularly preferred.

The thickness of cathode 6 ranges from, for example, about 10 to about 5,000 Å, and more specifically, from about 50 to about 250 Angstroms. The Mg:Ag cathodes of U.S. Pat. No. 4,885,211 constitute one preferred cathode construction. Another preferred cathode construction is described in U.S. Pat. No. 5,429,884, wherein the cathodes are formed from lithium alloys with other high work function metals such as aluminum and indium. The disclosures of each of the patents are totally incorporated herein by reference.

Both the cathode 6 and anode 3 of the organic EL devices of the present invention can be of any convenient form. A thin, for example about 200 Angstroms, conductive anode layer can be coated onto a light transmissive substrate, for example, a transparent or substantially transparent glass plate or plastic film. The EL device can include a light transmissive anode 3 formed from tin oxide or indium tin oxide coated on a glass plate. Also, very thin, for example less than 200 Å, such as from about 50 to about 200 Å light-transparent metallic anodes, can be selected, such as gold, palladium, and the like. In addition, transparent or semitransparent thin, for example 200 Angstroms, conjugated polymers, such as polyaniline, polypyrrole, and the like, can be selected. Any light transmissive polymeric film, for example from about 50 to about 200 Angstroms in thickness, can be elected as the substrate. Further, suitable forms of the anode 3 and athode 6 are illustrated by U.S. Pat. No. 4,885,211, the disclosure of which is totally incorporated herein by reference.

The photoconductive imaging member can be comprised of a supporting substrate, such as MYLAR®, polymers, metals like aluminum, and thereover a photogenerating layer containing known photogenerating pigments, such as phthalocyanines, selenium, hydroxygallium phthalocyanines, titanyl phthalocyanines, perylenes, and the like, and which pigments can be dispersed in resin binders. In contact with the photogenerating layer and situated thereover is a charge transport layer comprised of the starburst amines illustrated herein, and which amines may be dispersed in resin binders. The resin binders, thickness of each of the layers, and amounts of components selected for each layer in the like are illustrated in a number of issued United States patents, such as U.S. Pat. Nos. 4,265,990; 4,585,884; 4,584,253; 4,563,408; 4,587,189; 4,555,463; 5,153,313; 5,614,493, and 5,189,155; and U.S. Pat. No. 5,645,965, the disclosures of each of these patents and patent application being totally incorporated herein by reference.

The following Examples are provided to further define various species of the present invention, it being noted that these Examples are intended to illustrate and not limit the scope of the present invention.

EXAMPLE I

Synthesis of Tris[4'-(phenyl-m-tolylamino)-1,1'-biphenyl-4-yl]amine. Compound (1)

A 250 milliliter 3-necked round bottom flask equipped with a mechanical stirrer, reflux condenser, and argon inlet was purged with argon and then charged with N-phenyl-N-m-tolyl benzidine (8.0 grams, 0.023 mol), 4'-iodo-N-phenyl-N-m-tolyl-4-aminobiphenyl (17.5 grams, 0.038 mol), xylene (15 milliliters), 1,10-phenanthroline (0.34 gram, 1.9 mmol), cuprous chloride (0.188 gram, 1.9 mmol), and potassium hydroxide flakes (17.06 grams, 0.3 mol). Under an argon atmosphere, the reaction mixture was heated to reflux with an oil bath and allowed to proceed at that temperature until chromatographic analysis indicated that the reaction was complete after approximately 6 hours. The oil bath was removed and 100 milliliters of toluene and 25 milliliters of water were then added with efficient stirring. The resulting two phase mixture was transferred into a separatory funnel and the layers separated. The organic phase was washed with water and treated under argon with 25 grams of alumina. After the alumina was filtered off, the organic phase was evaporated to remove most of the toluene. The above product, Compound (1), was obtained by recrystallization of the residue from cyclohexane. Yield: 12.3 grams; m.p. 234.28° C.; Tg 134° C.

EXAMPLE II

Synthesis of N,N-bis(4'-di-m-tolviamino-1,1'-biphenyl-4-yl)-N', N'-diphenylbenzidine—Comoound (2)

A 250 milliliter 3-necked round bottom flask equipped with a mechanical stirrer, reflux condenser, and argon inlet was purged with argon and then charged with N,N-diphenyl benzidine (6.056 grams, 0.009 mol), 4'-iodo-N-phenyl-N-m-tolyl-4-aminobiphenyl (6.734 grams, 0.015 mol), xylene (10 milliliters), 1,10-phenanthroline (0.135 gram, 0.75 mmol), cuprous chloride (0.074 gram, 0.75 mmol), and potassium hydroxide flakes (6.73 grams, 0.12 mol). Under an argon atmosphere, the reaction mixture was heated to reflux with an oil bath and allowed to proceed at that temperature until chromatographic analysis indicated that the reaction was complete after approximately 6 hours. The oil bath was removed and 100 milliliters of toluene and 10 milliliters of water were then added with efficient stirring. The resulting two phase mixture was transferred into a separatory funnel and the layers separated. The organic phase was washed with water and treated under argon with 20 grams of alumina. After the alumina was filtered off, the organic phase was evaporated to remove most of the toluene. The above product compound was obtained by recrystallization of the residue from cyclohexane. Yield: 8.75 grams; m.p. 254.5° C.; Tg 128° C.

EXAMPLE III

Synthesis of Tris[4'-(m-methoxydiphenylamino)-1, 1'-biphenyl-4-yl]amine—Compound (3)

A 250 milliliter 3-necked round bottom flask equipped with a mechanical stirrer, reflux condenser, and argon inlet was purged with argon and then charged with N-m-methoxyphenyl-N-phenylbenzidine (6.2 grams, 0.017 mol), 4'-iodo-N-m-methoxyphenyl-N-phenyl-4-aminobiphenyl (13.49 grams, 0.028 mol), xylene (15 milliliters), 1,10-phenanthroline (0.252 gram, 1.4 mmol), cuprous chloride (0.139 gram, 1.4 mmol), and potassium hydroxide flakes (12.57 gram, 0.224 mol). Under an argon atmosphere, the reaction mixture was heated to reflux with an oil bath and allowed to proceed at that temperature until chromatographic analysis indicated that the reaction was complete after approximately 8 hours. The oil bath was removed and 100 milliliters of toluene and 25 milliliters of water were then added with efficient stirring. The resulting two phase mixture was transferred into a separatory funnel and the layers separated. The organic phase was washed with water and treated under argon with 20 grams of alumina. After the alumina was filtered off, the organic phase was evaporated to remove most of the toluene. The crude product was further chromatographed on silica gel using a 10:1 hexane-toluene as an eluent to provide pure tris [4-(3-methoxydiphenylamino)-1,1'-biphenylyl]amine as amorphous powder. Yield: 10.1 grams.

EXAMPLE IV

Synthesis of Tris[4'-(diphenylamino)-1,1'-biphenyl-4-yl]amine—Compound (4)

A 250 milliliter 3-necked round bottom flask equipped with a mechanical stirrer, reflux condenser, and argon inlet was purged with argon and then charged with N,N-diphenylbenzidine (4.95 grams, 0.0147 mol), 4'-iodo-N,N-diphenyl-4-aminobiphenyl (11.0 grams, 0.0246 mol), xylene (15 milliliters), 1,10-phenanthroline (0.22 gram, 1.22 mmol), cuprous chloride (0.122 gram, 1.22 mmol), and potassium hydroxide flakes (11.04 grams, 0.197 mol). Under an argon atmosphere, the reaction mixture was heated to reflux with an oil bath and allowed to proceed at that temperature until chromatographic analysis indicated that the reaction was complete after approximately 6 hours. The oil bath was removed and 100 milliliters of toluene and 20 milliliters of water were then added with efficient stirring. The resulting two phase mixture was transferred into a separatory funnel and the layers separated. The organic phase was washed with water and treated under argon with 25 grams of alumina. After the alumina was filtered off, the organic phase was evaporated to remove the toluene. The above product compound was obtained by recrystallization of the residue from cyclohexane. Yield: 6.9 grams, m.p. 283.97° C., Tg 141° C.

EXAMPLE V

Synthesis of Tris[4'-(carbazol-9-yl)-1,1'-biphenyl-4-yl]amine—Compound (5)

A 250 milliliter 3-necked round bottom flask equipped with a mechanical stirrer, reflux condenser, and argon inlet was purged with argon and then charged with 4'-(9-carbazolyl)-4-aminobiphenyl (5.1 grams, 0.0153 mol), 4-(9-carbazolyl)-4'-iodo-1,1'-biphenyl (11.394 grams, 0.0255 mol), 1,3,5-trimethylbenzene (15 milliliters), 1,10-phenanthroline (0.23 gram, 1.28 mmol), cuprous chloride (0.126 gram, 1.28 mmol), and potassium hydroxide flakes (11.45 grams, 0.204 mol). Under an argon atmosphere, the reaction mixture was heated to reflux with an oil bath and allowed to proceed at that temperature until chromatographic analysis indicated that the reaction was complete after approximately 12 hours. The oil bath was removed and 150 milliliters of toluene and 15 milliliters of water were then added with efficient stirring. The resulting two phase mixture was transferred into a separatory funnel and the layers separated. The organic phase was washed with water and treated under argon with 20 grams of alumina. After the alumina was filtered off, the organic phase was evaporated to remove most of the toluene. The residue was chromatographed on silica gel using 10:1 cyclohexane-dichloromethane as an eluent to provide 2.1 grams of the product compound. m.p. 283.13° C.

EXAMPLE VI

An organic EL was prepared as illustrated in the appropriate previously recited copending applications Ser. Nos. 807,488, 807,489, 807,487 and U.S. Pat. No. 5,674,635, and for example, in the following manner:

1. An indium tin oxide, 500 Angstroms in thickness, (ITO) coated glass, about 1 millimeter in thickness, was cleaned with a commercial detergent, rinsed with deionized water and dried in a vacuum oven at 60° C. for 1 hour. Immediately before use, the glass was treated with UV ozone for 0.5 hour.

2. The ITO above prepared substrate was placed in a vacuum deposition chamber. The deposition rate and layer thickness were controlled by an Inficon Model IC/5 controller. Under a pressure of slightly less than about $5 \times 10^{-6}$ Torr a starburst aromatic amine, such as those of Examples I to IV, was evaporated from an electrically heated tantalum boat to deposit an 80 nanometer (800 Angstroms) hole transport layer on the ITO glass layer 1. The deposition rate of the amine compound was controlled at 0.6 nanometer/second.

3. Onto the transport layer of 2 was deposited tris(8-hydroxyquinolinate)aluminum at an evaporation rate of 0.6 nanometer/second to form an 80 nanometer electron injecting and transporting layer.

4. A 100 nanometer magnesium silver alloy was deposited at a total deposition rate of 0.5 nanometer/second onto the electron injecting and electron transporting layer of 3 by simultaneous evaporation from two independently controlled tantalum boats containing Mg and Ag, respectively. The typical composition was 9:1 in atomic ratio of Mg to Ag. Finally, a 200 nanometer silver layer was overcoated on the Mg:Ag cathode for the primary purpose of protecting the reactive Mg from ambient moisture.

The devices as prepared above were retained in a dry box which was continuously purged with nitrogen gas. The performance of the devices was assessed by measuring its current-voltage characteristics and light output under a direct current measurement. The current-voltage characteristics were determined with a Keithley Model 238 High Current Source Measure Unit. The ITO electrode was always connected to the positive terminal of the current source. At the same time, the light output from the device was monitored by a silicon photodiode.

The performance characteristics of the devices were evaluated under a constant current density of 33 mA/cm$^2$. The operation life was measured by a sustained operation time in which the light intensity reduced to a half level of the initial intensity. The initial light intensity and operation life of the devices utilizing starburst amine compounds (1) to (5) are summarized in the following table.

| Compound No. | L$_0$ (cd/m$^2$) | Operation life (hours) |
|---|---|---|
| 1 | 750 | 230 |
| 2 | 730 | 250 |
| 3 | 810 | 150 |
| 4 | 720 | 245 |
| 5 | 510 | 260 |

These results demonstrate that a sustained high level of light output can be achieved in the organic EL devices comprising a starburst aromatic amine hole transport component. Furthermore, an organic EL device utilizing the starburst aromatic amine compound (2) as the hole transporting layer displayed no change in its current-light intensity characteristics even after it was subjected to a temperature of 60° C. for 72 hours.

Photoconductive layered devices can be prepared as illustrated herein, and more specifically, as illustrated in the relevant United States patents recited herein, and in U.S. Pat. No. 5,645,965, the disclosure of which is totally incorporated herein by reference, and wherein the starburst amine can function as the charge transport component.

Other modifications of the present invention will occur to those of ordinary skill in the art subsequent to a review of the present application. These modifications, and equivalents thereof, are intended to be included within the scope of the invention.

What is claimed is:

1. An organic electroluminescent (EL) device comprised of an anode, a cathode and a starburst aromatic amine compound selected from the group consisting of tris [4'-(carbazol-9-yl)-1,1'-biphenyl-4-yl]amine, tris[4'-(8H-10H-acridin-10-yl)-1,1'-biphenyl-4-yl]amine, tris [4'-(9,9-dimethyl-9H-10H-acridin-10-yl)-1,1'-biphenyl-4-yl]amine, N,N-bis[4'-(phenyl-m-tolylamino)-1,1'-biphenyl-4-yl]-4'-(carbazol-9-yl)-1,1'-biphenyl-4-amine, N,N-bis[4'-(carbazol-9-yl)-1,1-'-biphenyl-4-yl]-N'-phenyl-N'-m-tolylbenzidine N,N-bis[4'-(1-naphthylphenylamino)-1,1'-biphenyl-4-yl]-4'-(carbazol-9-yl)-1,1'-biphenyl-4-amine, and N,N-bis[4'-(9H-10H-acridin-10-yl)-1,1'-biphenyl-4-yl]-4'-(9H-10H-acridin-10-yl)-3,3'-dimethyl-1,1'-biphenyl-4-amine.

2. An EL device in accordance with claim 1 wherein the starburst aromatic amine functions as a hole injecting and hole transport medium.

3. An EL device in accordance with claim 1 wherein the starburst aromatic amine is present on said anode, and on said amine there is present an electron injecting and electron transporting layer, and on said injecting layer said cathode is present.

4. An EL device in accordance with claim 1 wherein the starburst aromatic amine is present as a layer on said anode, and on said amine layer there is present an electron injecting and electron transporting layer, on said injecting layer said cathode is present, and wherein said anode is present on a supporting substrate.

5. A device in accordance with claim 4 wherein the substrate is a polymer.

6. A device in accordance with claim 4 wherein the substrate is comprised of glass.

7. A device in accordance with claim 4 wherein the anode is indium tin oxide, tin oxide, gold, or platinum.

8. A device in accordance with claim 4 wherein the anode is a conductive carbon black.

9. A device in accordance with claim 4 wherein the electron injecting and electron transporting layer is comprised of anthracene, phenanthracene, pyrene, a metal thioxinoid, metal chelates of 8-hydroxyquinolinene, or perylene.

10. A device in accordance with claim 4 wherein the cathode is an alkaline metal, an alkaline earth metal, or a rare earth metal.

11. A device in accordance with claim 4 wherein the cathode is lithium, magnesium, or calcium.

* * * * *